US006969667B2

(12) United States Patent
Liebeskind et al.

(10) Patent No.: US 6,969,667 B2
(45) Date of Patent: Nov. 29, 2005

(54) ELECTRICAL DEVICE AND METHOD OF MAKING

(75) Inventors: John Liebeskind, Corvallis, OR (US); James C. McKinnell, Salem, OR (US); Paul J. Benning, Corvallis, OR (US); Chien-Hua Chen, Corvallis, OR (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 443 days.

(21) Appl. No.: 10/114,392

(22) Filed: Apr. 1, 2002

(65) Prior Publication Data

US 2003/0183307 A1 Oct. 2, 2003

(51) Int. Cl.⁷ .............................................. H01L 21/30
(52) U.S. Cl. ..................... 438/455; 438/456; 438/458
(58) Field of Search ..................... 438/107, 118, 119, 438/455, 456; 478/458

(56) References Cited

U.S. PATENT DOCUMENTS

| 6,252,229 B1 * | 6/2001 | Hays et al. ............... 250/338.4 |
| 6,429,511 B2 * | 8/2002 | Ruby et al. .................. 257/704 |
| 2001/0022207 A1 | 9/2001 | Hayes et al. ................. 148/158 |
| 2002/0053735 A1 * | 5/2002 | Neuhaus et al. ............ 257/728 |
| 2002/0119396 A1 * | 8/2002 | Jiang et al. .................. 430/311 |

* cited by examiner

*Primary Examiner*—Tom Thomas
*Assistant Examiner*—N. Drew Richards

(57) ABSTRACT

An electrical device includes a plurality of integrated circuits respectively fabricated in a first substrate bonded to a second substrate by a bond that deforms above, but not below, a deformation condition. The deformation condition can be a predetermined pressure from opposing surfaces on the first and second substrates or it can be a predetermined combination of temperature and pressure from opposing surfaces on the first and second substrates.

40 Claims, 6 Drawing Sheets

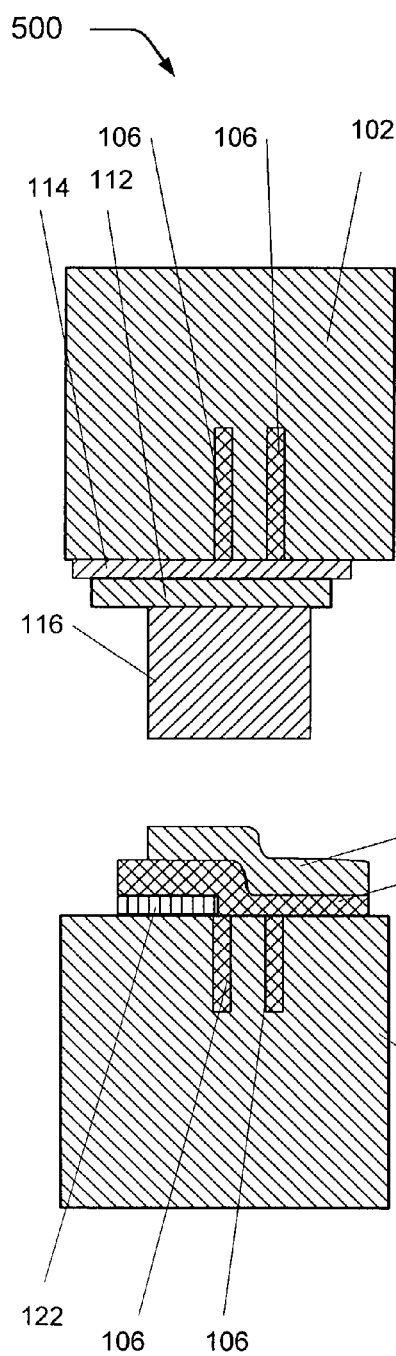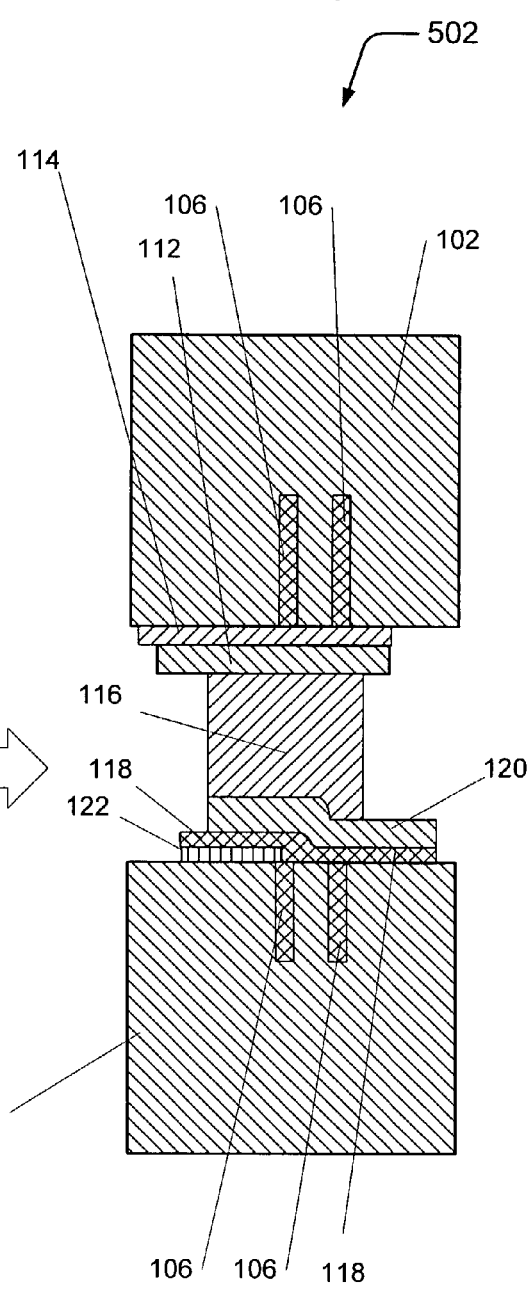

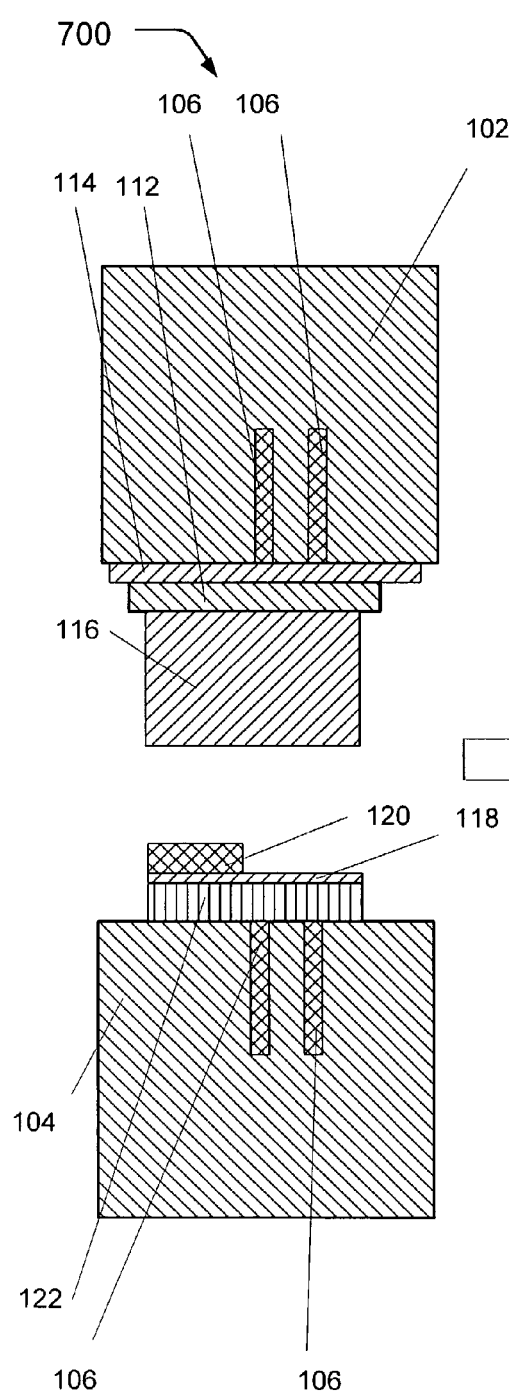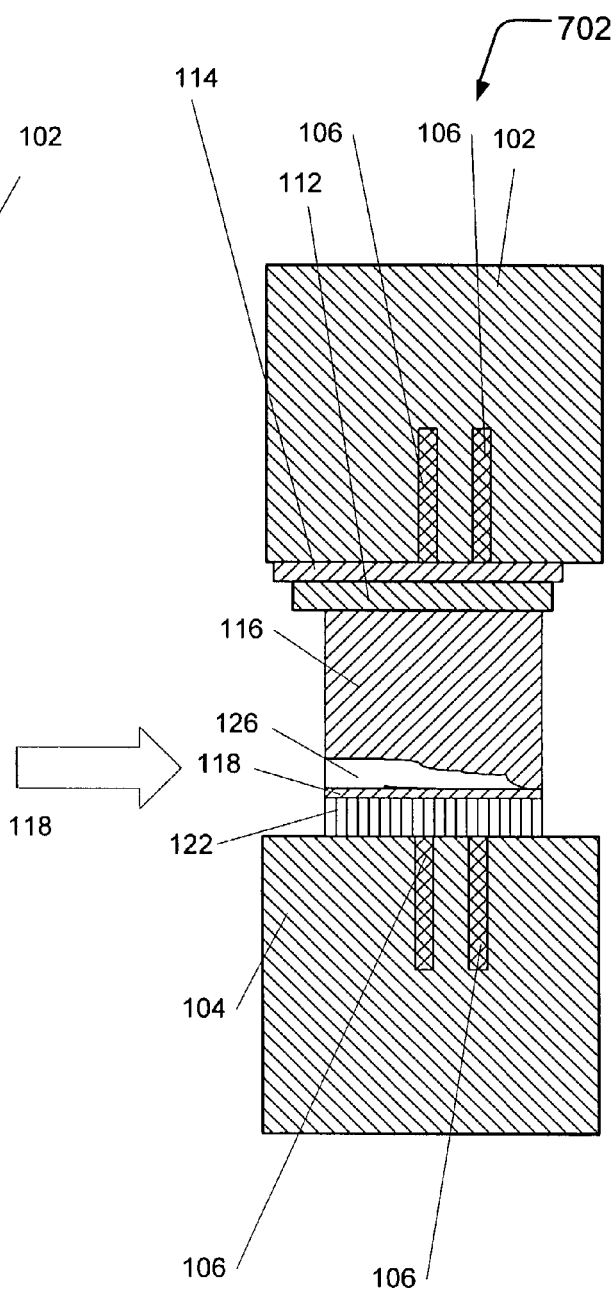

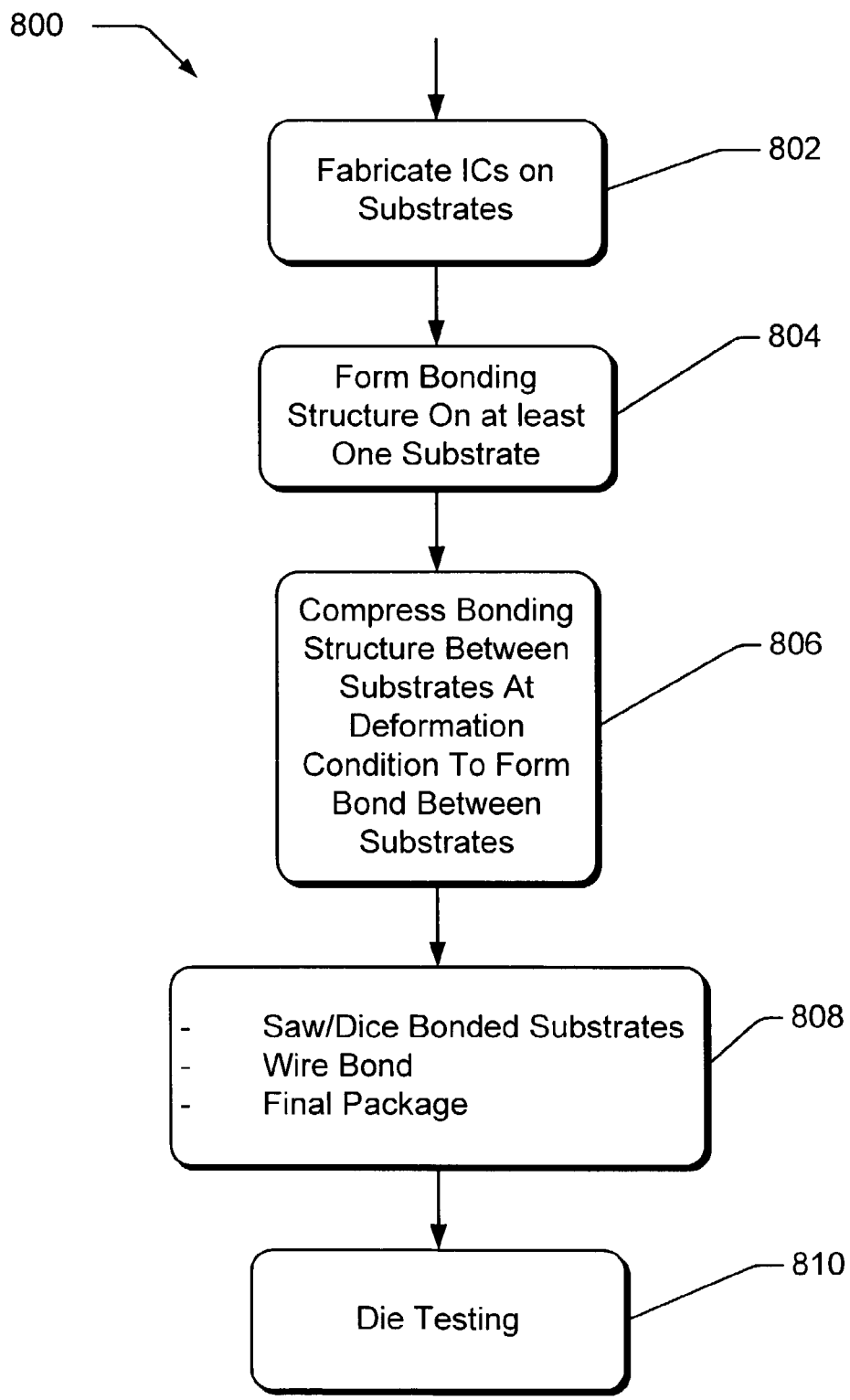

bers.
ELECTRICAL DEVICE AND METHOD OF MAKING

The present invention relates to an electrical device, and is more particularly related to an electrical device having substrates bonded together by a bonding structure.

BACKGROUND OF THE INVENTION

In large scale integration, electrical devices such as complementary metal-oxide semiconductor (CMOS) circuitry are fabricated in large quantities on substrates. These substrates can be bonded together using microfabrication techniques to efficiently manufacture micromachined structures. The term "semiconductor substrate" includes semiconductive material. The term is not limited to bulk semiconductive material, such as a silicon wafer, either alone or in assemblies comprising other materials thereon, and semiconductive material layers, either alone or in assemblies comprising other materials. The term "substrate" refers to any supporting structure including but not limited to the semiconductor substrates described above. A substrate may be made of silicon, glass, gallium arsenide, silicon on sapphire (SOS), epitaxial formations, germanium, germanium silicon, diamond, silicon on insulator (SOI) material, selective implantation of oxygen (SIMOX) substrates, and/or like substrate materials. The substrate can be made of silicon, which is typically single crystalline.

In many applications, the substrates being bonded together can be semiconductor substrates such as silicon wafers. In wafer bonding, two or more wafers are bonded together. Each wafer can have a plurality of electrical devices formed thereon prior to the wafer bonding process. The bonding process can be used, although need not be used, to form a controlled environment, such as a hermetic seal, between the bonded adjacent wafers. Electrical interconnections can be made between the wafers. After the wafers are bonded together, saw/dice, wire bond and final package processes can be performed, as are conventional. Typical singulated die can be MicroElectroMechanical Systems (MEMS), such as field emitter display devices, accelerometers, bolometers, mirror arrays, optical switches, pressure gauges, memory storage devices such as atomic resolution storage devices, turbine chambers, and combustion chambers.

Packaging bonded wafers is a cost savings over packaging individual die. Due to the high costs of die-level packaging, wafer-level packaging is viewed as important for MEMS products. MEMS devices that are fabricated in wafer-level packaging can include such aspects as electrical interconnections between wafers and a fixed gap spacing distance between adjacent wafers. Optionally, a hermetic or gas impervious seal can also be formed to maintain a specific environment such as a vacuum, a specific gas, or protection from gases that are in the ambient or external environment. These aspects can be significant for MEMS such as atomic resolution storage devices, field emitter displays, or other highly integrated components made on multiple wafers. It would be an advantage in the art to develop electrical device fabrication processes that form a fixed gap spacing distance between adjacent wafers while minimizing the number of process steps so as to result in low cost and high yields.

SUMMARY OF THE INVENTION

In one embodiment of the present invention, an electrical device includes a plurality of integrated circuits and a first substrate bonded to a second substrate by a bond that deforms above, but not below, a deformation condition of pressure from opposing surfaces on the first and second substrates with or without temperature variations.

These and other features of the present invention will become more fully apparent from the following description and appended claims, or may be learned by the practice of the invention as set forth hereinafter.

DESCRIPTION OF THE DRAWINGS

To further clarify the above and other advantages and features of the present invention, a more particular description of the present invention will be rendered by reference to specific embodiments thereof which are illustrated in the appended drawings. The same numbers are used throughout the drawings to reference like features and components. It is appreciated that these drawings depict only typical embodiments of the present invention and are therefore not to be considered limiting of its scope. The invention will be described and explained with additional specificity and detail through the use of the accompanying drawings in which:

FIGS. 5a and 5b are cross-sectional views of an embodiment of the present invention each depicting a partial cut away view of two substrates before and after bonding;

FIGS. 7a and 7b are cross-sectional views of an embodiment of the present invention each depicting a partial cut away view of two substrates before and after bonding;

FIG. 8 depicts a flow chart illustrating a process, according to an embodiment of the present invention, that can be used to form structures seen in FIGS. 1–7.

DETAILED DESCRIPTION

The present invention bonds substrates together using a bonding structure that can have one or more components. The bonding structure is deformed under a deformation condition between adjacent substrates until the substrates are bonded together. Optionally, the bonding structure can be designed such that a gas impervious chamber is formed between the bonded substrates. The bonding structure can include a weak component and may also include a strong component. The weak component can optionally be designed so that, when deformed, it will at least in part define the gas impervious chamber. The weak component deforms more readily than the strong component. The material of which the weak component is composed can have a strength and/or melting point that can be lower than that of a material of which the strong component is composed. Alternatively, if the weak and strong components are made from the same material or materials with similar strengths, the cross-sectional area of the weak component will be less than that of the strong component. The deformation condition to which the bonding structure is subjected while being compressed between adjacent substrates can include variations in temperature and/or pressure. While the bonding structure deforms above, but not below, the deformation condition, the weak component of the bonding structure will be deformed when subjected to the deformation condition while the strong component will either not deform or deform substantially less than the weak component.

One or more of the substrates, prior to the bonding process, can have a plurality of integrated circuited fabricated therein or thereon. By way of example, one or more of the substrates can be a semiconductor wafer that is subjected to microelectronic device fabrication processes so as to form a plurality of CMOS circuits in portions thereof. When so fabricated, a plurality of wafers can be bonded together. The bonded wafers can then be subjected to saw/dice, wire bonding, and final package processes so as to form electrical devices such as MicroElectroMechanical System (MEMS) devices. Examples of MEMS devices that can be formed using embodiments of the present invention include field emitter display devices, accelerometers, bolometers, mirror arrays, optical switches, pressure gauges, memory storage devices such as atomic resolution storage devices, turbine chambers, and combustion chambers.

Figure 1:
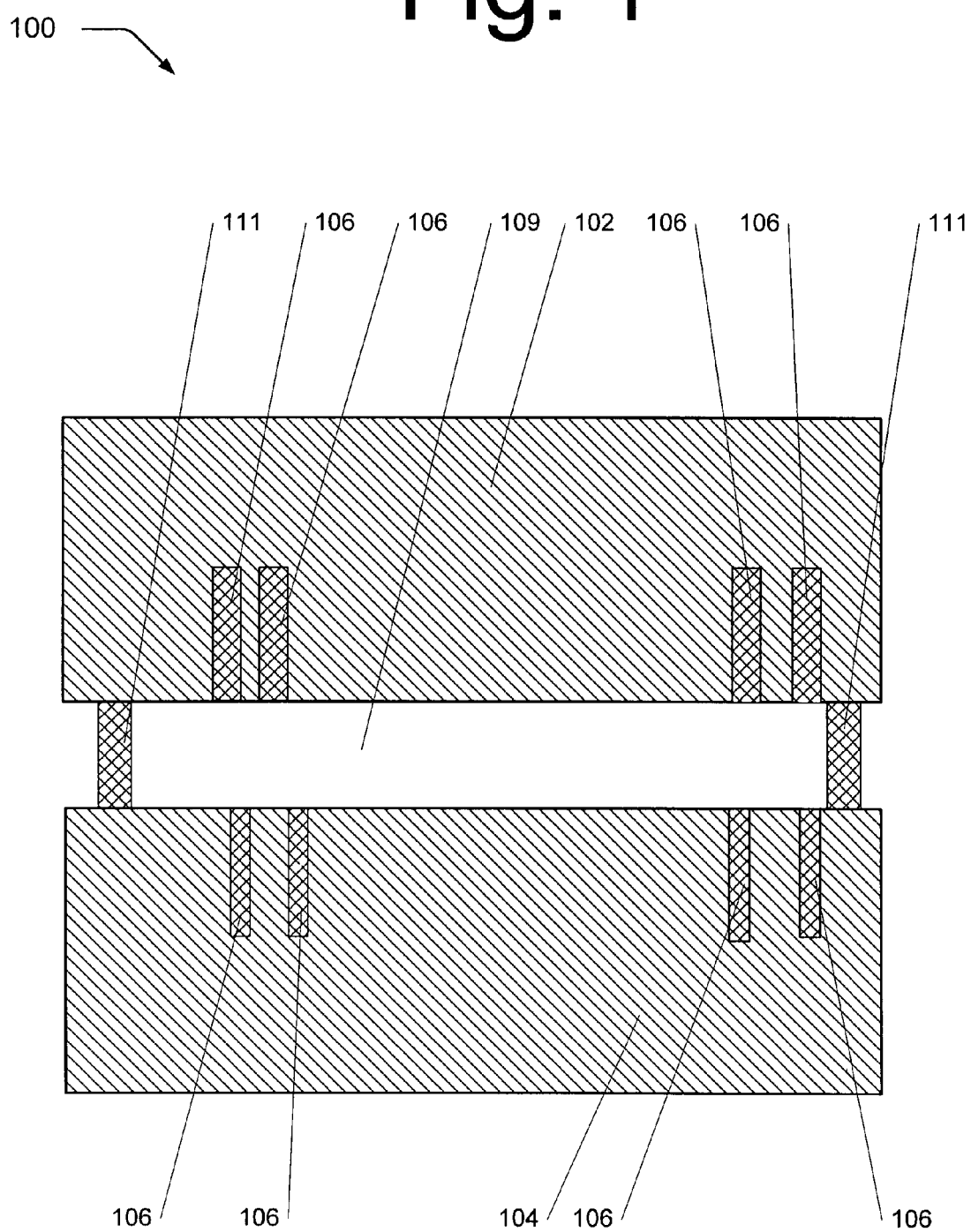
FIG. 1 is a cross-sectional view of an embodiment of the present invention depicting two wafers that are bonded together, each of which has fabricated therein a plurality of integrated circuits, where a bonding structure bonds the wafers together at a fixed separation gap and can optionally form a gas impervious chamber between the bonded wafers.

By way of example and illustration of the foregoing, FIG. 1 shows a portion of an electrical device 100 that includes a portion of a semiconductor wafer, hereinafter wafer 102, that is bonded to a portion of another semiconductor wafer, hereinafter wafer 104, each of which has fabricated therein a plurality of CMOS circuits 106. Electrical interconnections can be made between wafers 102, 104. Wafers 102, 104 are bonded together by a bonding structure. Bonding structure 111 has included therein a weak component and optionally a strong component. The weak component of bonding structure 111 deforms when subjected to a predetermined deformation condition and the strong component of bonding structure 111 will not deform when subjected to the predetermined deformation condition. Wafers 102, 104 can be fabricated such that, after the wafer bonding process, CMOS circuits 106 in wafers 102, 104 are in various states of electrical communication through electrical interconnections or traces (not shown) on wafers 102, 104.

When so desired, bonding structure 111 seen in FIG. 1 can be optionally designed such that the predetermined deformation condition will cause bonding structure 111 to form a gas impervious chamber 109 between bonded wafers 102, 104. As such, bonding structure 111 can be used, although it need not be used, to define and form a seal to a gas impervious chamber 109. In an embodiment of the present invention where bonding structure 111 is used to form a seal to gas impervious chamber 109, the seal can be formed by the inclusion within bonding structure 111 of a first material that, upon melting, wets a surface area on each of wafers 102, 104. The wetted surface areas upon of wafers 102, 104 can be bordered by a second material that, when the first material is melted, does not wet the respective second material of which the surface of wafers 102, 104 are composed. In general, these wetting and non-wetted surfaces of wafers 102, 104 can optionally be employed to serve the purpose of limiting the flow of molten or liquid material of which bonding structure 111 is composed. By way of example, silicon dioxide can be used to control the flow of molten gold alloy upon the surface of the bonded substrates. When the molten gold alloy is solidified in a region defined by a border of silicon dioxide, a seal to a gas impervious chamber can thereby be formed.

In another embodiment of the present invention, bonding structure 111 can be composed of a partially melted seal base material having a solid fraction of a solder or braze alloy that acts as a non-deformable material. The solder or braze alloy is chosen to keep at least about ninety percent (90%) of the alloy solid while the melting fraction forms a bond between a seal and a seal base. When wafers 102, 104 are brought above the melting temperature of the seal base material, a portion of the seal base material melts so as to form a solder/braze joint. Flow of the molten seal base material can be controlled by surrounding the seal base with material that molten seal base material does not wet. The pressure applied to the joint during bonding is in the range of less than about 300 MPa, where the time to form the seal can be less than 1000 hours, and the seal can be formed in a temperature range of about 20 degrees Centigrade to about 1500 degrees Centigrade. By way of example, the alloy can be composed of gold with silicon of about five percent weight (Si5 wt % Au) that is formed at about 400 degrees Centigrade.

Figure 2:
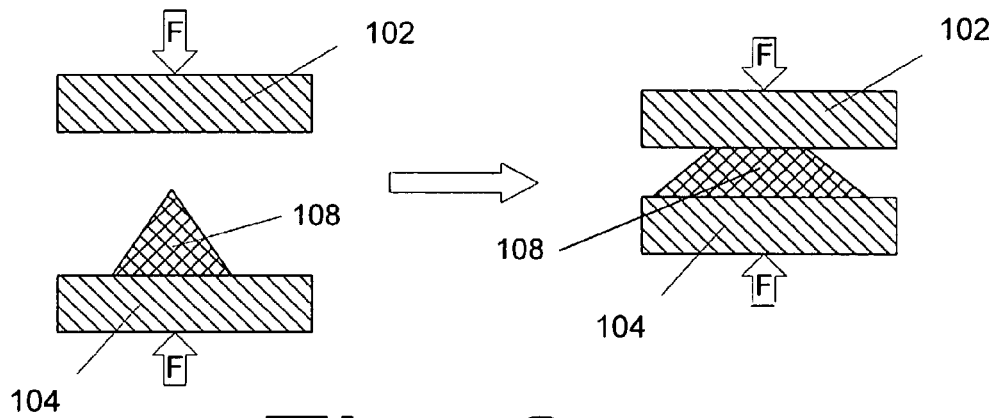
FIGS. 2 through 4 are cross-sectional views of respective embodiments of the present invention each depicting a pair of partial cut away views of two substrates before and after bonding.
Figure 3:
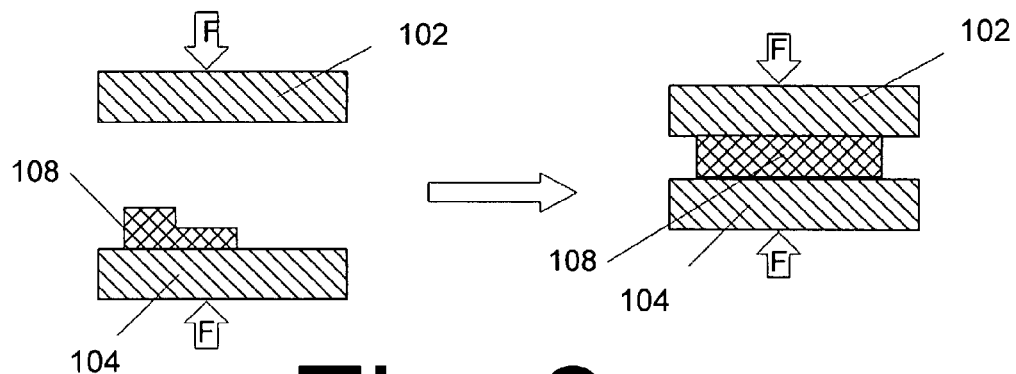
Figure 4:
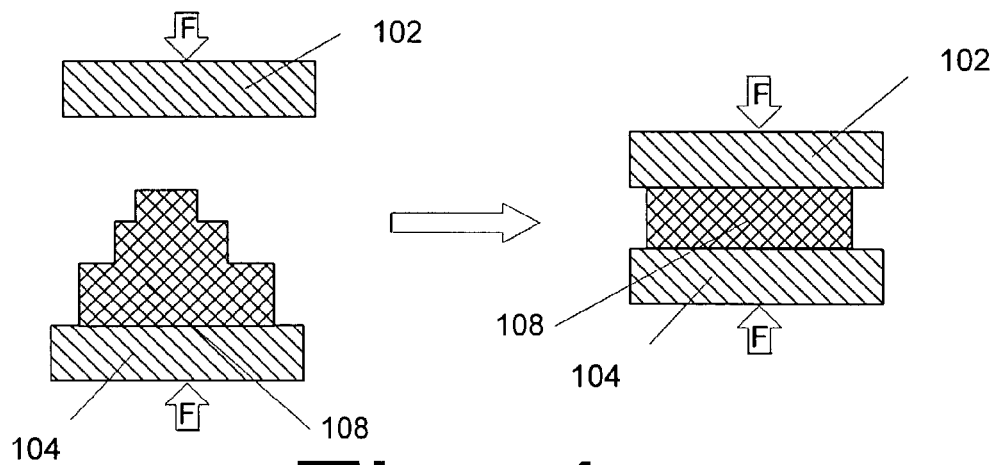

The bonding structure can assume a variety of forms, examples of which are seen in FIGS. 2–4 where force F is applied to respective surfaces on wafers 102, 104 both in a 'before' illustration on the left and in an 'after' illustration on the right. The 'after illustration' shows the result of the compression of the bonding structure between wafers 102, 104. The 'after' illustration is representative of the deformation of the bonding structure, the accomplishment of a uniform and predetermined gap between opposing surfaces on wafers 102, 104, and the bonding together of wafers 102, 104. Optionally, the 'after' illustration can be representative of the use of the deformed bonding structure to form a seal to a gas impervious chamber between wafers 102, 104.

In FIG. 2; a weak bonding structure 108 is compressed between wafers 102, 104. As weak bonding structure 108 is deformed, force F is distributed over an increasingly larger surface area of opposing surfaces on wafers 102, 104 so as to effectively reduce the pressure on weak bonding structure 108. At a predetermined pressure, the material properties of weak bonding structure 108 will cause a resistance to and a cessation of further deformation such that the gap between wafers 102, 104 is set at a predetermined distance as seen in FIG. 2. Alternatively, wafers 102, 104 can be heated during compression at or near a melting point of a material that is included in weak bonding structure 108. When a predetermined gap between wafers 102, 104 is approaching, the temperature of wafers 102, 104 can be lowered so that weak bonding structure 108 will cease to deform via solidification of weak bonding structure 108. Additionally, force F and/or the temperature can be varied in a predetermined sequence to achieve the predetermined gap between wafers 102, 104 such that weak bonding structure 108 will cease to deform accordingly.

FIG. 3 shows 'before' and 'after' illustrations of wafers 102, 104 having a weak bonding structure 108 there between. The top surface of weak bonding structure 108 has a first width that is less than a second width below the top surface. Constant force F is applied to respective surfaces on wafers 102, 104 to compress weak bonding structure 108 between wafers 102, 104. As weak bonding structure 108 is deformed, force F is distributed over a first surface area at the top surface. Once the deformation reaches the second width, force F will be distributed over a largely increased surface area, resulting in a much smaller pressure upon weak bonding structure 108. The material properties of weak bonding structure 108 will cause a resistance to and a cessation of further deformation such that the gap between wafers 102, 104 is set at a predetermined distance as seen in FIG. 3. Alternatively, wafers 102, 104 can be heated during compression at or near a melting point of a material that is included in weak bonding structure 108. When a predetermined gap between wafers 102, 104 is approaching, the temperature of wafers 102, 104 can be lowered so that weak bonding structure 108 will cease to deform through the solidification thereof. Additionally, force F and/or the temperature can be varied in a predetermined sequence to achieve the predetermined gap between wafers 102, 104 such that weak bonding structure 108 will cease to deform accordingly. FIG. 4 illustrates a still further embodiment of the present invention where a kind of progressive step function for pressure and surface area quantities is realized during the deformation of weak bonding structure 108.

FIGS. 5a–5b show, respectively, an electrical device 500 in a 'before' illustration and an electrical device 502 in an 'after' illustration that is accomplished by the compression of electrical device 500. Device 502 has wafers 102, 104 with a bonding structure there between that includes a bond ring 116, a bond contact 120, and a spacer contact 122. Each of wafers 102, 104 have a plurality of CMOS circuits 106 fabricated therein. Spacer contact 122 is upon wafer 104 and beneath bond contact 120 which is also upon wafer 104. Both bond ring 116 and bond contact 120 are deformed, as seen in FIG. 5b, so as to bond together wafers 102,104 in a separation of a predetermined gap. Optionally, bond ring 116 and bond contact 120 can be designed such that, upon deformation, a gas imperious chamber (not shown) is formed. The deformation progresses until a predetermined deformation condition is reached at which the predetermined gap separates wafers 102, 104. Here, the predetermined deformation condition occurs when the materials of which bond ring 116 and bond contact 120 are composed resist further deformation. Spacer contact 122 can but need not be deformed by the compression.

An adhesion layer 114 is on wafer 102 and a diffusion barrier layer 112 is on adhesion layer 114. Diffusion barrier layer 112 prevents diffusion of materials into adhesion layer 114 and wafer 102. Adhesion layer 114 is adhered to wafer 102. A diffusion barrier-adhesion layer 118 upon wafer 104 and spacer contact 122 can serve one or both of the functions of preventing diffusion of materials into wafer 104 and adhering bond contact 120 to spacer contact 122. Spacer contact 122 is over wafer 104 and beneath diffusion barrier-adhesion layer 118.

The material of which bond contact 120 is composed can have a melting point and/or strength that is lower than that of the material of which spacer contact 122 is composed. The material of which bond ring 116 is composed, which can include one or more components, can have the same or a lower melting point and/or strength than that of the material of which bond contact 120 is composed. When bond ring 116 and bond contact 120 are composed of gold or an alloy thereof, the gold interdiffuses across the interface so as to form a relatively strong bond. Other materials performing similarly could also be used, as well as those materials that do so in a temperature range below about 500 degrees Centigrade so that any CMOS circuitry included in wafers 102, 104 would not be damaged. The material of which bond contact 120 is composed deforms more readily than that of the material of which spacer contact 122 is composed. Spacer contact 122 is generally, although not necessarily, composed of a dielectric material such as wet or dry silicon dioxide (SiO2), a nitride material including silicon nitride, tetraethylorthosilicate (Si—OC2H5)4) (TEOS) based oxides, borophosphosilicate glass (BPSG), phosphosilicate glass (PSG), borosilicate glass (BSG), oxide-nitride-oxide (ONO), polyamide film, tantalum pentoxide (Ta2O5), plasma enhanced silicon nitride (P—SiNx), titanium oxide, oxynitride, germanium oxide, a spin on glass (SOG), any chemical vapor deposited (CVD) dielectric including a deposited oxide, a grown oxide, and or like dielectric materials. Bond contact 120 and bond ring 116 can both be composed of gold or an alloy thereof.

Figure 6A:
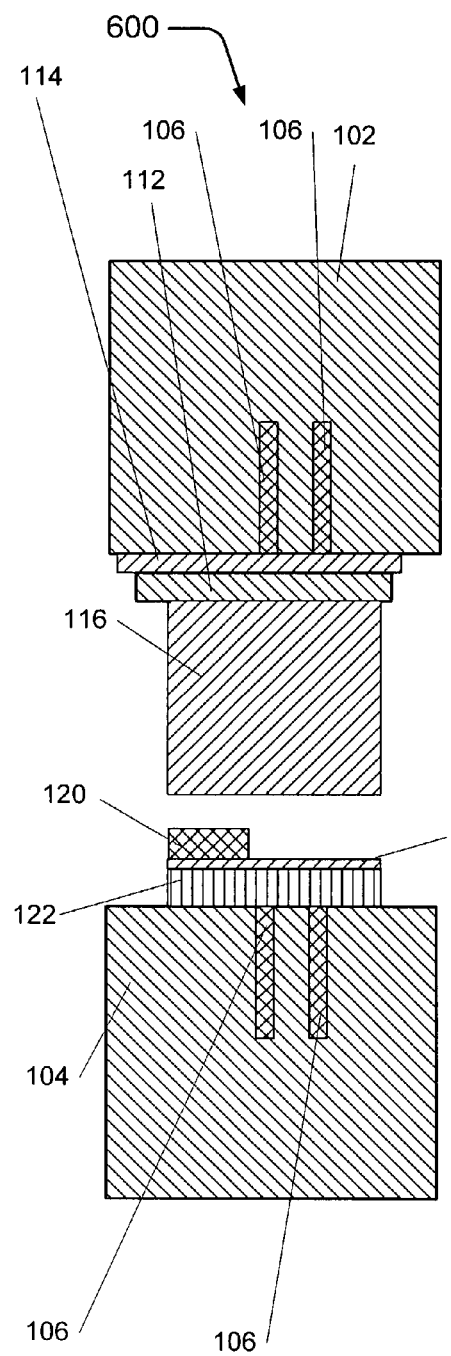
FIGS. 6a and 6b are cross-sectional views of an embodiment of the present invention each depicting a partial cut away view of two substrates before and after bonding.
Figure 6B:
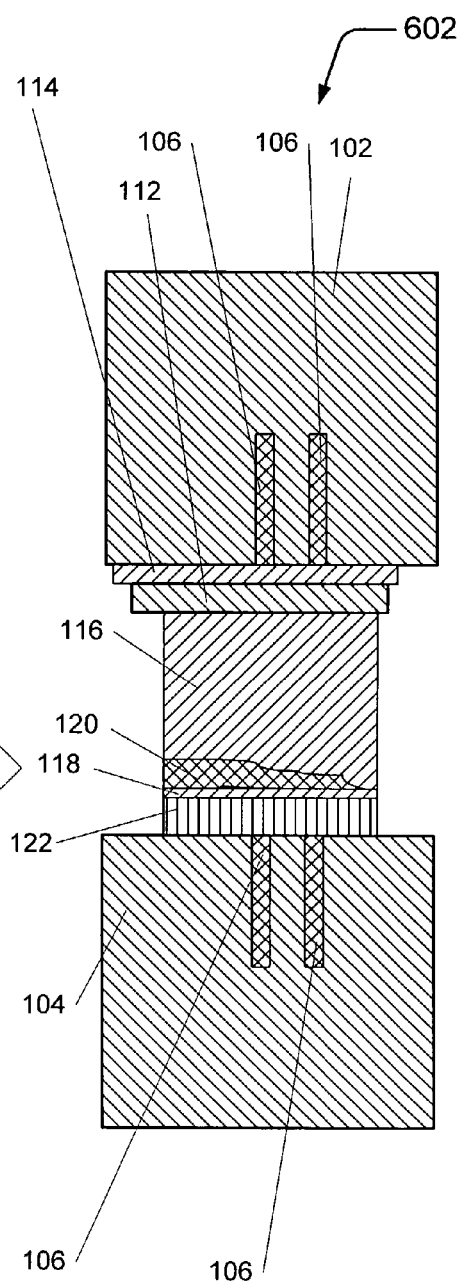

FIGS. 6a–6b show, respectively, an electrical device 600 in a 'before' illustration and an electrical device 602 in an 'after' illustration after compression of electrical device 600, each having wafers 102, 104 with a bonding structure there between that includes a bond ring 116, a bond contact 120, and a spacer contact 122. Spacer contact 122 is over wafer 104, underneath diffusion barrier-adhesion layer 118, and beneath bond contact 120. Both bond ring 116 and bond contact 120 are deformed to bond together wafers 102, 104 in a separation of a predetermined gap, as seen in FIG. 6b. Optionally, the resultant bonding structure can be designed so as to form a closed region, a gas impervious chamber, or a hermetically sealed region (not shown). The deformation of the bonding structure can progress until a predetermined deformation condition is reached. Here, the predetermined deformation condition occurs when the materials of which bond ring 116 and bond contact 120 are composed resist further deformation. Spacer contact 122 can but need not be deformed by the compression.

FIGS. 7a–7b show, respectively, an electrical device 700 in a 'before' illustration and an electrical device 702 in an 'after' illustration after compression of electrical device 700, each having wafers 102, 104 with a bonding structure there between that includes a bond ring 116, a bond contact 120, and a spacer contact 122. Spacer contact 122 is upon wafer 104 and beneath diffusion barrier-adhesion layer 118 and bond contact 120. An alloy 126, which can be formed by diffusion or melting, such as a eutectic alloy or an intermetallic silicide alloy, is formed by bond ring 116 and bond contact 120 as bond contact 120 is deformed, whereas variation in temperature and/or pressure may also be used to form alloy 126. By way of example, bond ring 116 can be composed of gold or a gold alloy and bond contact 120 can be gold, silicon, or a gold film stack. The result of the compression between wafers 102, 104, the deformation of bond contact 120, and the formation of alloy 126 is the bonding together of wafers 102, 104 in a separation of a predetermined gap, where the deformation progresses until a predetermined deformation condition is reached. Here, the predetermined deformation condition occurs when alloy 126 forms and the material of which bond contact 120 is composed resists further deformation at a predetermined pressure. Spacer contact 122 can, but need not, be deformed by the compression. Optionally, the process and bonding structure can be designed such that a sealed region, a gas impervious chamber, or a hermetic seal is formed at least in part by bond ring 116, alloy 126, and deformed bond contact 120.

Electrical devices 502, 602, and 702, respectively seen in FIGS. 5b, 6b, and 7b, can be used in the fabrication of MEMS devices. A process 800 for doing so is seen in FIG. 8. At step 802 of FIG. 8, integrated circuits (ICs) are fabricated in substrates to be bonded together. At step 804, a bonding structure, which can include one or more components; is formed on one or more of the substrates that are to be bonded together. At step 806, the bonding structure is compressed between adjacent substrates to attain a deformation condition. The attainment of the deformation condition accomplishes the formation of a bond between the substrates. Optionally, the resulting bonding structure can be used to form a sealed region, a gas impervious chamber, or a hermetically sealed region between the bonded substrates. A predetermined gap or distance can exist between the bonded substrates as a result of the deformation condition. Electrical interconnections can also be made between the substrates. Following the substrate bonding steps, the bonded substrates are subjected to processes that include saw/dice, wire bond, and final package at step 808. Device or die testing can optionally be performed at step 810.

It should be recognized that, in addition to the bonded substrate embodiments of the present invention described above, this invention is also applicable to alternative bonded structure technologies, such as a die that encapsulates therein a closed environment or hermetic sealed atmosphere, and MEMS devices that can be formed by the foregoing processes including MEMS devices in air bag applications, field emitter display devices, accelerometers, bolometers, mirror arrays, optical switches, pressure gauges, memory storage devices such as atomic resolution storage devices, turbine chambers, and combustion chambers.

The process of bonding substrates together, which can include a heat treatment such as an annealing process, can be conducted at temperatures at or below approximately 450 degrees Celsius. An annealing chamber can be used to accomplish the bonding process. Although not necessary for implementing an embodiment of the present invention, the bonding process may change or "ramp" the temperature. By keeping temperatures of the bonding or annealing process below approximately 450 degrees Celsius, any CMOS circuitry included in either of the bonded substrates should not be damaged.

In the bonding process, the substrates can be pressed together at a pressure of about zero MPa to about 300 MPa to form a bond there between. A bond is "sufficient" for the purposes of the present invention when it is capable of maintaining an alignment of adjacent substrates with respect to each other during normal operation of the electrical device. As such, after the bonding process, the bond should be sufficient to keep the bonded substrates attached and aligned as well as being configured to form an electrical connection between the integrated circuits in the respective substrates. One skilled in the art should realize that a broad variety of dimensions, materials, temperatures, times, and pressures are contemplated to accomplish the devices, structures, and processes disclosed herein, and that the embodiments of the present invention can be fabricated using a broad variety of process equipment in a semiconductor fabrication operation.

The present invention may be embodied in other specific forms without departing from its spirit or essential characteristics. The described embodiments are to be considered in all respects only as illustrative and not restrictive. The scope of the present invention is, therefore, indicated by the appended claims rather than by the foregoing description. All changes which come within the meaning and range of equivalency of the claims are to be embraced within their scope.

What is claimed is:

1. A method comprising bonding opposing surfaces on a plurality of wafers using a bonding structure, wherein:
   one or more of the wafers has a plurality of integrated circuits fabricated therein;
   the bonding includes deforming the bonding structure until a predetermined gap exists between the opposing surfaces and a deformation condition is applied to the bonding structure at which the bonding structure deforms above the deformation condition, but not below the deformation condition; and
   the deformation condition is selected from the group consisting of:
   a predetermined pressure on the bonding structure; and
   a predetermined combination of temperature and pressure on the bonding structure.

2. The method as defined in claim 1, further comprising:
   forming electrical interconnections between the integrated circuits in the wafers;
   dicing the bonded wafers by saw/dice operations; and
   wire bonding and packaging the dice.

3. The method as defined in claim 2, wherein the dice are microelectronic devices that are each selected from the group consisting of an accelerometer, a bolometer, a mirror array, an optical switch, a pressure gauge, a memory storage device, an atomic resolution storage device, a turbine chamber, and a combustion chamber.

4. A method comprising bonding opposing surfaces on first and second substrates together with a bonding structure, wherein:
   each of the first and second substrates has a plurality of integrated circuits fabricated therein;
   the bonding includes deforming the bonding structure until a deformation condition is applied to the bonding structure at which the bonding structure deforms above the deformation condition, but not below the deformation condition; and
   the deformation condition is selected from the group consisting of:
   a predetermined pressure on the bonding structure; and
   a predetermined combination of temperature and pressure on the bonding structure.

5. The method as defined in claim 4, wherein the bonding further comprises applying constant equal opposing forces respectively to the first and second substrates, whereby:
   the surface area of the bonding structure upon the opposing surfaces of the first and second substrates increases with the deformation of the bonding structure; and
   the pressure upon the bonding structure decreases to the predetermined pressure at which the bonding structure ceases to deform.

6. The method as defined in claim 4, further comprising:
   forming the bonding structure so as to form a gas impervious seal to a chamber between the first and second substrates, wherein the bonding structure includes a wetting material that, when melted, wets a surface area on the opposing surfaces of the first and second substrates where the gas impervious seal is formed; and
   forming a non-wetting material on the opposing surfaces of the first and second substrates and bordering the surface area where the gas impervious seal is to be formed, wherein the non-wetting material, when melted, does not wet the opposing surfaces on the first and second substrates.

7. The method as defined in claim 4, further comprising:
   forming the bonding structure so as to form a gas impervious seal to a chamber between the first and second substrates, wherein the bonding structure includes a wetting material on a surface area on the opposing surfaces of the first and second substrates where the gas impervious seal is formed; and
   forming a non-wetting material on the opposing surfaces of the first and second substrates and bordering the surface area where the gas impervious seal is to be formed, wherein:

the wetting material, when melted, has a first surface tension on each of the opposing surfaces on the first and second substrates; and the non-wetting material, when melted, has a second surface tension on each of the opposing surfaces on the first and second substrates that is higher than the first surface tension.

8. The method as defined in claim 4, wherein:

the bonding structure further comprises first and second bonding materials that are and are not, respectively, deformed when subjected to the deformation condition; and each of the first and second bonding materials makes contact with each of the opposing surfaces of the first and second substrates.

9. The method as defined in claim 8, wherein the first and second bonding materials, respectively, have a lower and a higher strength.

10. The method as defined in claim 8, wherein the first and second bonding materials, respectively, have a lower and a higher melting point.

11. The method as defined in claim 4, further comprising interconnecting the plurality of integrated circuits in each of the first and second substrates to form a microelectronic device selected from the group consisting of an accelerometer, a bolometer, a mirror array, an optical switch, a pressure gauge, a memory storage device, an atomic resolution storage device, a turbine chamber, and a combustion chamber.

12. The method as defined in claim 4, wherein the bonding further comprises compressing the bonding structure between the opposing surfaces on the first and second substrates while applying the deformation condition to the bonding structure to deform the bonding structure until a predetermined gap exists between opposing surfaces on the first and second substrates.

13. The method as defined in claim 4, further comprising:
forming electrical interconnections between the integrated circuits in the first and second substrates;
forming dice by saw/dice operations performed on the first and second substrates; and
wire bonding and packaging the dice.

14. A method of making an electrical device, the method comprising
forming a bonding structure on at least one of first and second substrates each having a plurality of integrated circuits fabricated therein;
compressing the bonding structure between the opposing surfaces on the first and second substrates to deform the bonding structure until the bonding structure bonds together the first and second substrates and a deformation condition is applied to the bonding structure at which the bonding structure deforms above, but not below, and wherein the deformation condition which is selected from the group consisting of:
a predetermined pressure on the opposing surfaces of the first and second substrates on the bonding structure; and
a predetermined combination of temperature and pressure on the opposing surfaces of the first and second substrates on the bonding structure.

15. The method as defined in claim 14, wherein the compressing the bonding structure further comprises applying constant equal opposing forces respectively to the first and second substrates, whereby:

the surface area of the bonding structure upon the opposing surfaces of the first and second substrates increases with the deformation of the bonding structure; and the pressure upon the bonding structure decreases to the predetermined pressure at which the bonding structure ceases to deform.

16. The method as defined in claim 14, further comprising:
forming the bonding structure so as to form a gas impervious seal to a chamber between the first and second substrates, wherein the bonding structure includes a wetting material that, when melted, wets a surface area on the opposing surfaces of the first and second substrates where the gas impervious seal is formed; and
forming a non-wetting material on the opposing surfaces of the first and second substrates and bordering the surface area where the gas impervious seal is to be formed, wherein the non-wetting material, when melted, does not wet the opposing surfaces on the first and second substrates.

17. The method as defined in claim 14, further comprising:
forming the bonding structure so as to form a gas impervious seal to a chamber between the first and second substrates, wherein the bonding structure includes a wetting material on a surface area on the opposing surfaces of the first and second substrates where the gas impervious seal is formed; and
forming a non-wetting material on the opposing surfaces of the first and second substrates and bordering the surface area where the gas impervious seal is to be formed, wherein:
the wetting material, when melted, has a first surface tension on each of the opposing surfaces on the first and second substrates; and
the non-wetting material, when melted, has a second surface tension on each of the opposing surfaces on the first and second substrates that is higher than the first surface tension.

18. The method as defined in claim 14, wherein:
the bonding structure further comprises first and second bonding materials that are and are not, respectively, deformed when subjected to the deformation condition; and
each of the first and second bonding materials makes contact with each of the opposing surfaces of the first and second substrates.

19. The method as defined in claim 18, wherein the first and second bonding materials, respectively, have a lower and a higher strength.

20. The method as defined in claim 18, wherein the first and second bonding materials, respectively, have a lower and a higher melting point.

21. The method as defined in claim 14, further comprising interconnecting the plurality of integrated circuits in each of the first and second substrates to form a microelectronic device selected from the group consisting of an accelerometer, a bolometer, a mirror array, an optical switch, a pressure gauge, a memory storage device, an atomic resolution storage device, a turbine chamber, and a combustion chamber.

22. The method as defined in claim 14, further comprising compressing the bonding structure between the opposing surfaces on the first and second substrates while applying the deformation condition to the bonding structure to deform the bonding structure until a predetermined gap exists between opposing surfaces on the first and second substrates.

23. A method of making an electrical device, the method comprising:
  forming a bond ring on a portion of a first semiconductor wafer having a plurality of CMOS circuits fabricated therein;
  forming a spacer contact on a portion of a second semiconductor wafer having a plurality of CMOS circuits fabricated therein;
  forming a bond contact on the spacer contact and on a surface on the portion of the second semiconductor wafer;
  pressing the bond ring against the bond contact to deform the bond contact until:
    the bond contact is bonded to the bond ring; and
    the portions of the first and second semiconductor wafers are subjected to a deformation state selected from the group consisting of:
      a predetermined pressure at an interface between the bond ring and the bond contact; and
      a predetermined combination of temperature and pressure at the interface between the bond ring and the bond contact;
  wherein the spacer contact is not deformed by the deformation state.

24. The method as defined in claim 23, wherein:
  the forming of the bond ring on the portion of the first semiconductor wafer further comprises forming at least one of an adhesion layer and a diffusion barrier layer to which the bond ring is adhered; and
  the forming of the spacer contact on the portion of the second semiconductor wafer further comprises forming at least one of an adhesion layer and a diffusion barrier layer to which the spacer contact is adhered.

25. The method as defined in claim 23, wherein the bond ring is not deformed when subjected to the deformation state.

26. The method as defined in claim 23, wherein the bond ring has a thickness between the portions of the first and second semiconductor wafers that is greater than that of either the bond contact or the spacer contact.

27. The method as defined in claim 23, wherein:
  the spacer contact comprises a dielectric; and
  both the bond ring and the bond contact comprise a metal or a metal alloy.

28. The method as defined in claim 23, further comprising:
  pressing the bond ring against the bond contact to deform the bond contact until the bond contact and the bond ring together form a gas impervious seal to a chamber between the first and second semiconductor wafers, wherein the bond contact, when melted, wets a surface area on the portion of the second semiconductor wafer; and
  forming a non-wetting material upon another surface area on the portion of the second semiconductor wafer to surround the surface area of the seal to be formed, wherein the non-wetting material, when melted, does not wet said another surface area.

29. The method as defined in claim 23, further comprising:
  pressing the bond ring against the bond contact to deform the bond contact until the bond contact and the bond ring together form a gas impervious seal to a chamber between the first and second semiconductor wafers, wherein the bond contact, when melted, has a first surface tension on a surface area on the portion of the first semiconductor wafer; and
  forming, surrounding the surface area and on another surface area on the portion of the first semiconductor wafer, a non-wetting material that, when melted, has a second surface tension that is greater than the first surface tension.

30. The method as defined in claim 23, wherein:
  the spacer contact comprises silicon dioxide; and
  both the bond ring and the bond contact comprise gold alloy.

31. The method as defined in claim 23, further comprising pressing the bond ring against the bond contact until a predetermined gap exists between opposing surfaces on the first and second semiconductor wafers.

32. A method of making an electrical device, the method comprising:
  forming a bond ring on a portion of a first semiconductor wafer having a plurality of CMOS circuits fabricated therein;
  forming a spacer contact on a portion of a second semiconductor wafer having a plurality of CMOS circuits fabricated therein;
  forming a bond contact on the spacer contact; and
  pressing the bond ring against the bond contact to deform the bond contact until: the
  bond contact is bonded to the bond ring; and
    the portions of the first and second semiconductor wafers are subjected to a deformation state during which the spacer contact is not deformed, the deformation state being selected from the group consisting of:
      a predetermined pressure between the bond ring and the bond contact; and
      a predetermined combination of temperature and pressure between the bond ring and the bond contact.

33. The method as defined in claim 32, wherein:
  the forming the bond ring on the portion of the first semiconductor wafer further comprises forming the bond ring so as to be adhered to a surface on the portion of the first semiconductor wafer by at least one of an adhesion layer and a diffusion barrier layer; and
  the forming the spacer contact on the portion of the second semiconductor wafer further comprises forming the spacer contact so as to be adhered to a surface on the portion of the second semiconductor wafer by at least one of an adhesion layer and a diffusion barrier layer.

34. The method as defined in claim 32, wherein the bond ring is deformed when subjected to the deformation state.

35. The method as defined in claim 32, wherein, after said pressing, the bond ring has a thickness between the portions of the first and second semiconductor wafers that is greater than that of both of the spacer contact and the bond contact.

36. The method as defined in claim 32, wherein:
  the spacer contact comprises a dielectric; and
  both the bond ring and the bond contact comprise a metal or a metal alloy.

37. The method as defined in claim 32, wherein:
  the spacer contact comprises a dielectric;
  the bond contact comprises a thin film stack; and
  the bond contact is bonded to the bond ring by a metal or a metal alloy.

38. The method as defined in claim 32, wherein, after said pressing, a surface area of an interface between the spacer contact and the bond ring is smaller than a surface area of an interface between the bond contact and the bond ring.

39. The method as defined in claim 32, wherein, after said pressing, the
the spacer contact, the bond contact, and the bond ring together form a gas impervious seal to a chamber between the portions of the first and second semiconductor wafers.

40. The method as defined in claim 32, further comprising pressing the bond ring against the bond contact until a predetermined gap exists between opposing surfaces on the first and second semiconductor wafers.

* * * * *